(12) United States Patent
Kellerman et al.

(10) Patent No.: US 9,957,636 B2
(45) Date of Patent: May 1, 2018

(54) SYSTEM AND METHOD FOR CRYSTALLINE SHEET GROWTH USING A COLD BLOCK AND GAS JET

(71) Applicant: Varian Semiconductor Equipment Associates, Inc., Gloucester, MA (US)

(72) Inventors: Peter L. Kellerman, Essex, MA (US); Brian Mackintosh, Concord, MA (US); Frederick M. Carlson, Potsdam, NY (US); David Morrell, Wakefield, MA (US); Ala Moradian, Beverly, MA (US); Nandish Desai, Waltham, MA (US); Dawei Sun, Nashua, NH (US); Frank Sinclair, Boston, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 1029 days.

(21) Appl. No.: 14/226,991

(22) Filed: Mar. 27, 2014

(65) Prior Publication Data

US 2018/0047864 A1   Feb. 15, 2018

(51) Int. Cl.
| | |
|---|---|
| C30B 35/00 | (2006.01) |
| C30B 15/06 | (2006.01) |
| C30B 15/00 | (2006.01) |

(52) U.S. Cl.
CPC .............. C30B 15/06 (2013.01); C30B 15/00 (2013.01); C30B 35/00 (2013.01)

(58) Field of Classification Search
CPC .......... C30B 15/00; C30B 15/06; C30B 35/00
See application file for complete search history.

(56) References Cited

U.S. PATENT DOCUMENTS

| | | | | |
|---|---|---|---|---|
| 4,226,834 A | * | 10/1980 | Shudo | ..................... C30B 15/06 |
| | | | | 117/212 |
| 4,264,407 A | | 4/1981 | Shudo et al. | |
| 4,289,571 A | | 9/1981 | Jewett | |
| 4,417,944 A | | 11/1983 | Jewett | |
| 4,749,438 A | * | 6/1988 | Bleil | ....................... C30B 13/00 |
| | | | | 117/220 |

(Continued)

FOREIGN PATENT DOCUMENTS

WO    2010-056350 A2    5/2010

OTHER PUBLICATIONS

ISR and Written Opinion issued in corresponding PCT/US2015/020381, dated May 14, 2015.

(Continued)

*Primary Examiner* — Robert M Kunemund

(57) ABSTRACT

A crystallizer for growing a crystalline sheet from a melt may include a cold block having a cold block surface that faces an exposed surface of the melt, the cold block configured to generate a cold block temperature at the cold block surface that is lower than a melt temperature of the melt at the exposed surface. The system may also include a nozzle disposed within the cold block and configured to deliver a gas jet to the exposed surface, wherein the gas jet and the cold block are interoperative to generate a process zone that removes heat from the exposed surface at a first heat removal rate that is greater than a second heat removal rate from the exposed surface in outer regions outside of the process zone.

20 Claims, 10 Drawing Sheets

(56) References Cited

U.S. PATENT DOCUMENTS

| | | | |
|---|---|---|---|
| 5,128,111 A * | 7/1992 | Kuehnle | ................. C30B 15/00 |
| | | | 117/202 |
| 6,800,137 B2 * | 10/2004 | Pandelisev | .............. C30B 11/00 |
| | | | 117/212 |
| 7,294,197 B1 | 11/2007 | Gralenski | |
| 7,816,153 B2 | 10/2010 | Kellerman et al. | |
| 7,855,087 B2 | 12/2010 | Kellerman et al. | |
| 2003/0111105 A1 | 6/2003 | Tsukuda et al. | |
| 2007/0158654 A1 | 7/2007 | Kholodenko et al. | |
| 2010/0086465 A1 | 4/2010 | Kojima et al. | |
| 2010/0288186 A1 | 11/2010 | Bang | |
| 2013/0213296 A1 | 8/2013 | Kellerman et al. | |

OTHER PUBLICATIONS

B. Kudo, Improvement in the Horizontal Ribbon Growth Technique for Single Crystal Silicon, Journal of Crystal Growth 50, 1980, pp. 247-259, North-Holland Publishing Company, The Netherlands.
Supplemental European Search Report dated Oct. 2, 2017 for European Patent Appln No. 15770386.9.

* cited by examiner

SYSTEM AND METHOD FOR CRYSTALLINE SHEET GROWTH USING A COLD BLOCK AND GAS JET

STATEMENT AS TO FEDERALLY SPONSORED RESEARCH OR DEVELOPMENT

The U.S. Government has a paid-up license in this invention and the right in limited circumstances to require the patent owner to license others on reasonable terms as provided for by the terms of contract number DE-EE0000595 awarded by the U.S. Department of Energy.

FIELD

The present embodiments relate to growth of crystalline material from a melt and more particularly to a system and method of cooling the melt using a cold block and gas jet.

BACKGROUND

Silicon wafers or sheets may be used in, for example, the integrated circuit or solar cell industry. Demand for solar cells continues to increase as the demand for renewable energy sources increases. One major cost in the solar cell industry is the wafer or sheet used to make solar cells. Reductions in cost to the wafers or sheets may reduce the cost of solar cells and make this renewable energy technology more prevalent. One method that has been investigated to lower the cost of materials for solar cells is the vertical pulling of thin silicon ribbons from a melt that cool and solidify into a crystalline sheet. However, temperature gradients that develop during vertical pulling of silicon sheets may result in poor quality multi-grain silicon. Horizontal ribbon growth (HRG) where sheets are pulled horizontally along the surface of a melt has also been investigated. Earlier attempts include those that employ a gas "showerhead" to provide cooling to achieve the continuous surface growth needed for ribbon pulling. These early attempts have not met the goal of producing a reliable and rapidly drawn wide ribbon with uniform thickness that is "production worthy." Radiative cooling of a silicon melt has been proposed as an alternative method of forming crystalline silicon. However, a problem arises because radiative cooling by itself may not provide sufficiently rapid removal of heat to properly crystallize a silicon sheet.

It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a crystallizer for growing a crystalline sheet from a melt may include a cold block having a cold block surface that faces an exposed surface of the melt, the cold block configured to generate a cold block temperature at the cold block surface that is lower than a melt temperature of the melt at the exposed surface. The system may also include a nozzle disposed within the cold block and configured to deliver a gas jet to the exposed surface, wherein the gas jet and the cold block are interoperative to generate a process zone that removes heat from the exposed surface at a first heat removal rate that is greater than a second heat removal rate from the exposed surface in outer regions outside of the process zone.

In a further embodiment, a method for growing a crystalline sheet from a melt includes arranging a cold block above an exposed surface of the melt and generating, at a cold block surface of the cold block that faces the melt, a cold block temperature that is lower than a melt temperature of the melt at the exposed surface. The method further includes delivering a gas jet to the exposed surface through a nozzle disposed within the cold block, wherein the gas jet and the cold block are interoperative to generate a process zone that removes heat from the melt surface at a first heat removal rate that is greater than a second heat removal rate from the melt surface in regions outside of the process zone.

DETAILED DESCRIPTION

The present embodiments provide systems and apparatus to grow a continuous crystalline sheet of semiconductor material such as silicon form a melt using horizontal growth. In particular, the systems disclosed herein are configured for both initializing and sustaining the growth of a continuous crystalline sheet or ribbon of silicon on the surface of a melt, such that the sheet formed is single-crystal (monocrystalline), wide, of uniform thinness, and drawn from the melt at a fast rate, such as greater than 1 millimeter per second. In various embodiments a fluid cooled crystallizer is configured to cool the surface of a melt in a controlled and uniform manner that produces a process zone that forms a narrow band or zone of intense heat removal. In various embodiments, the peak rate of heat removal from a silicon melt surface exceeds 100 W/cm$^2$ and in some instances is greater than 500 W/cm$^2$. As discussed below this high heat removal rate is especially advantageous for growing a high quality monocrystalline silicon ribbon because of the nature of the crystalline growth of silicon in a melt surface.

Figure 1A:
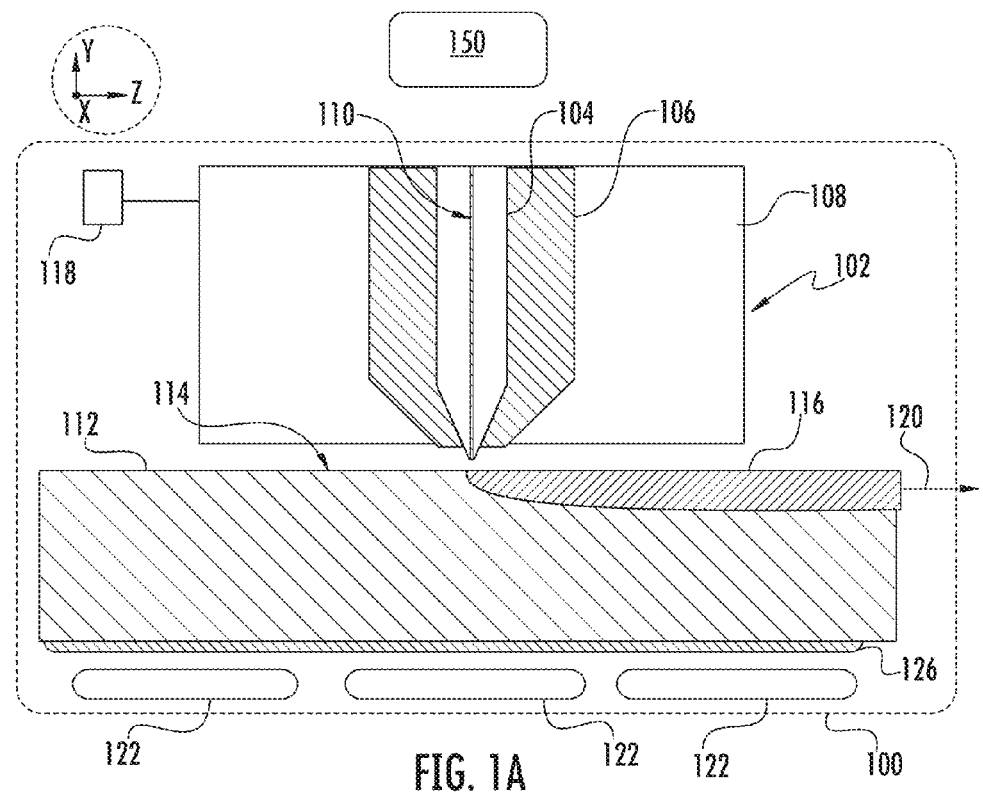
FIG. 1A depicts a side cross-sectional view of a system according to embodiments of the disclosure.

FIG. 1A depicts a side view of a system 100 for horizontal growth of a crystalline sheet from a melt consistent with the present embodiments. The system 100 includes a crystallizer 102 and crucible 126, although just a lower portion of the crucible is shown for clarity. Moreover, in this figure and others to follow various components may not be presented to scale with respect to one another or with respect to different directions. The crucible 126 may contain a melt 112, such as a silicon melt. The crystallizer 102 or crucible 126, or both may be movable along a direction parallel to the Y-axis of the Cartesian coordinate system illustrated, so as to position the crystallizer 102 at a desired distance from an upper surface of the melt 112, which is denoted as exposed surface 114. The exposed surface 114 represents the surface that is adjacent ambient atmosphere in the system 100 as opposed to surfaces of the melt 112 that are adjacent a solid surface of the crucible 126. The system 100 further includes a heater or heaters, such as heaters 122, which may supply heat to the crucible 126 and thereby to the melt 112. The heaters 122 may be powered separately to supply a similar amount of heat or different amount of heat at different points along the X-Z plane. The heat may flow through the melt 112 with at least a component of the heat flow directed upwardly along the Y-axis in FIG. 1A.

As detailed below, the heat flow generated from heaters 122 and heat flow rate from the exposed surface 114, which is termed herein "heat removal rate," may be set to maintain a molten surface at exposed surface 114, except in specific areas where crystallization takes place. In particular, as detailed below, crystallization may take place in a region or process zone (not shown in FIG. 1A) that is proximate the crystallizer 102. In the present embodiments, the crystallizer 102 may generate a rate of heat removal in the process zone that is sufficiently rapid to form a crystalline material in a region near or at the exposed surface 114. As detailed below, the heat removal takes place locally over just a portion of the exposed surface 114 in a controlled manner, resulting in formation of monocrystalline silicon of a desired thickness and low level of defects. It may be understood that "heat removal" refers to processes that facilitate heat flow from the exposed surface 114. Even without components to facilitate "heat removal" such as the crystallizer 102, heat may flow from the exposed surface 114 upwardly. However, the crystallizer 102 may cause heat removal at portions of the exposed surface 114 that is much greater than heat flow in other portions of the exposed surface 114, so that crystallization is localized adjacent the crystallizer 102.

The system 100 further may include a crystal puller (not shown) configured to draw a seed 116 along a pull direction 120 that is parallel to the Z-axis so as to pull a continuous sheet of crystalline silicon towards the right as shown. By control of the rate of heat removal proximate the crystallizer 102, the heat generated by the heaters 122, and the pull rate along the pull direction 120, a crystalline sheet of desired thickness and quality may be obtained. In particular, to control crystallization of a sheet the crystallizer 102 is provided with a cold block 106 that is configured to generate a cold block temperature at a cold block surface that is lower than a melt temperature of the melt 112 at the portion of the exposed surface 114 that faces the cold block surface. As discussed below, the crystallizer 102 further includes a nozzle 104 disposed within the cold block 106 and configured to deliver a gas jet to the exposed surface 114. The gas jet and cold block are interoperative to generate a process zone that removes heat from the exposed surface 114 at a first heat removal rate that is greater than a second heat removal rate from the exposed surface 114 in regions outside of the process zone. By proper arrangement and operation of the nozzle and cold block, a well defined and uniform process zone may be created over a very narrow region, which facilitates better growth of a low defect monocrystalline sheet.

In the embodiment of FIG. 1A the crystallizer 102 includes a nozzle 104 that is configured to supply a gas jet to the exposed surface 114, where "gas jet" refers to a flow of gas at a rapid rate through a narrow opening as discussed below. The gas jet may be provided by a gas control system 150 that directs gas into the nozzle 104 at a determined rate. In various embodiments, the nozzle 104 is composed of a material that is resistant to degradation in a high temperature environment, especially an environment that includes molten silicon. The nozzle may be composed of fused silica (fused quartz), for example, which is both chemically resistant to attack by silicon and is thermally stable at the melting temperature (~1685 K) of silicon. The gas provided to the exposed surface 114 may be used to increase the heat removal rate from the exposed surface 114 in a process region proximate the crystallizer 102. In some embodiments, gas supplied through the nozzle 104 may be helium or other inert gas, or may be hydrogen. The embodiments are not limited in this context.

As shown in FIG. 1A the nozzle 104 is disposed within a cold block 106, which may be cooled by a fluid such as water or ethylene glycol that is directed to flow within cavities (not shown) in the cold block 106. Accordingly, the cold block 106 may be maintained at a temperature much lower than that of the melt 112. For example, if the melt 112 is pure silicon, a temperature of the exposed surface 114 may be maintained within several degrees of 1685 K in order to maintain the exposed surface 114 in a molten state. At the same time the cold block may be maintained at a temperature within a range of 300K to 400 K when cooling water is provided the cold block 106. In one embodiment, the cold block 106 may be fabricated from Nickel, which has a high thermal conductivity and high melting point suitable for operation as a cold block in close proximity to a high temperature melt. As noted, the nozzle 104 and cold block 106 may be interoperative to generate a narrow process zone ### where heat removal rate is sufficiently intense to generate a desired crystallization at or near the exposed surface 114 while regions outside the process zone remain molten. As further shown in FIG. 1A, the crystallizer 102 includes an enclosure 108, which may be maintained at an enclosure temperature that is higher than that of the cold block 106. The enclosure 108 may include multiple components including insulation and heaters that are used to maintain the enclosure 108 at elevated temperature. For example, the enclosure 108 may be maintained at a temperature that is within 50 K of the temperature of the exposed surface 114. The enclosure 108 defines an opening in which the cold block surface of cold block 106 is disposed opposite the exposed surface 114. In other words within an opening defined by enclosure 108 a cold block surface of the cold block 106 faces the exposed surface 114 of the melt 112. The area of this opening includes the bottom surface of the cold block 104 as discussed below with respect to FIG. 1B. Thus, heat removal rate for regions of the exposed surface 114 that are proximate the enclosure 108 may be less than heat removal rate for a process zone proximate the cold block 106. It is to be noted that in this figure and others to follow top portions of the crystallizer 102 are not shown for simplicity.

Figure 1B:
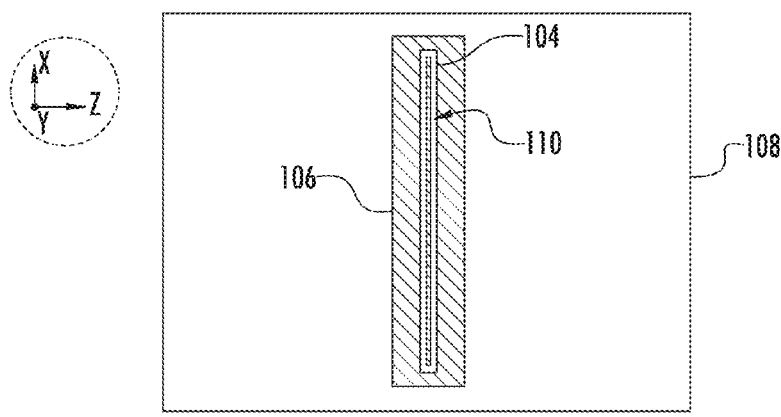
FIG. 1B depicts a bottom view of a portion of the system of FIG. 1A.

In various embodiments, the nozzle 104 and cold block 106 may have an elongated cross-section in the X-Z plane. FIG. 1B shows a bottom view of the crystallizer 102 according to various embodiments, in which the nozzle 104 and cold block 106 are elongated in a direction parallel to the X-axis. This direction may be referred to as a transverse direction to indicate that it is transverse to a pull direction in which a crystalline sheet is pulled, as discussed below. As also shown in FIG. 1B, an aperture 110 that is provided within the nozzle 104 and also has an elongated cross-section in the X-Z plane with a long axis that extends along the transverse direction. The aperture 110 may be a single narrow opening through which a gas jet is provided to the exposed surface 114. As illustrated in FIG. 1A, the aperture 110 extends through the entire height of the nozzle 104 to conduct gas from the top of the nozzle 104 to a region just above the exposed surface 114. In some embodiments discussed below multiple small gas feeds may be arranged at the top of the aperture 110 in a linear fashion parallel to the X-axis to provide gas jets to the exposed surface 114. As discussed below, the dimensions of the nozzle 104, aperture 110, and cold block 106 along the X-axis, as well as the number of gas feeds used may thereby define a width of a crystalline sheet that is pulled along the pull direction 120 shown in FIG. 1A.

Figure 1C:
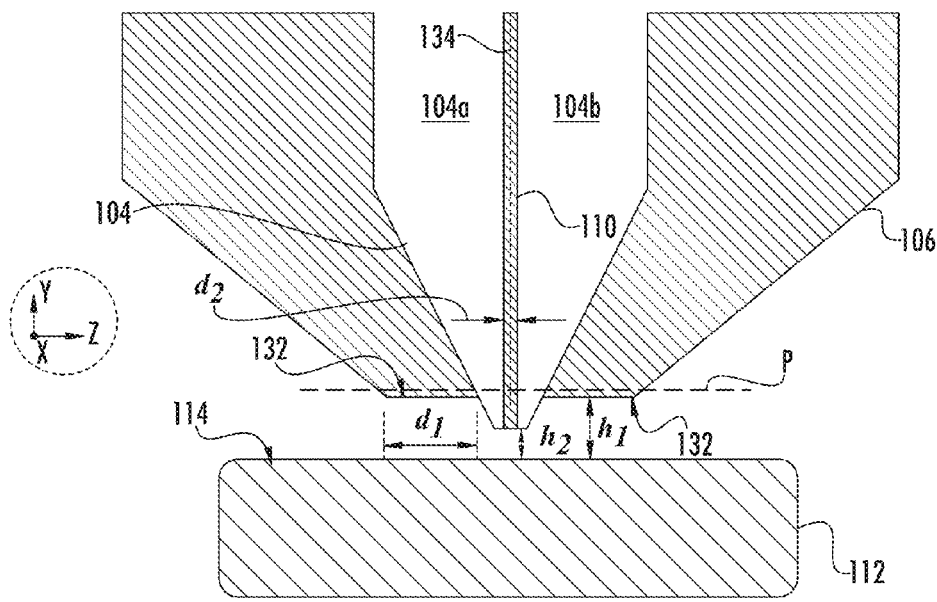
FIG. 1C is a close-up side cross-sectional view of a part of the system of FIG. 1A.
Figure 1D:
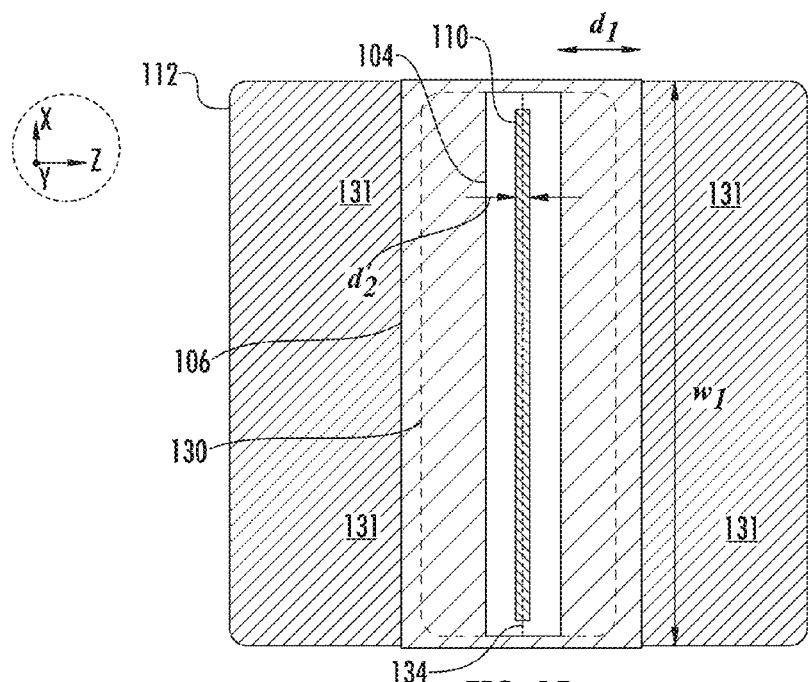
FIG. 1D is a close-up top cross-sectional view of a part of the system of FIG. 1A.

FIG. 1C and FIG. 1D show a side view and top view, respectively, of a portion of the crystallizer 102. In particular, FIG. 1C and FIG. 1D depict portions of the cold block 106 and nozzle 104 that are closest to the exposed surface 114 of the melt 112. For clarity, the enclosure 108 is not shown.

In various embodiments, the geometrical relationship of the cold block, nozzle and exposed surface of a melt is arranged to facilitate generation of a narrow process zone for rapid heat removal from the surface. In particular embodiments, the nozzle is disposed at a first distance above the exposed surface, and the cold block surface is disposed at a second distance above the exposed surface that is greater than the first distance. In other words, the nozzle extends below an adjacent cold block and is thereby positioned closer to the surface of a melt.

In the example of FIG. 1C, the cold block 106 and nozzle 104 may be positioned at a desired height from the exposed surface 114 to produce a desired crystallization process. The height may be defined by a first height $h_1$, which represents a distance along a perpendicular to the exposed surface 114 that separates the exposed surface 114 from a bottom surface 132 of the cold block 106. The bottom surface 132 is the cold block surface that faces the exposed surface 114 of melt 112 acts as a sink for heat flowing from the exposed surface 114. As noted, other surfaces of the cold block 106 are enclosed by the enclosure 108 which is not shown in FIG. 1C. The height may also be defined by a second height $h_2$, which represents a distance that separates the exposed surface 114 from a bottom of the nozzle 104. As shown in FIG. 1C, in this embodiment and other embodiments, the nozzle may extend below the bottom surface 132 such that $h_2 < h_1$. In various embodiments the $h_1$ may be between 0.25 mm and 5 mm, and the distance $h_2$ may be between 0.1 mm and 3 mm although the embodiments are not limited in this context. The adjustment of the value of $h_2$ or $h_1$ may be performed using an actuator 118 connected to the crystallizer 102 in one implementation, as shown in FIG. 1A.

In some embodiments, the aperture length $d_2$ of the aperture 110 along the Z-axis may be 0.05 mm to 0.5 mm. In embodiments in which the nozzle 104 is made from fused silica, the nozzle 104 may be constructed from two parts, a nozzle part 104a and nozzle part 104b. In some embodiments, these two parts may be assembled so as to define an interface 134 that runs perpendicular to the exposed surface 114 when the nozzle 104 is assembled and arranged within the system 100. Alternatively, these two parts may be assembled so as to define an interface 134 that runs at a non-zero angle with respect to a perpendicular to the exposed surface 114 when the nozzle 104 is assembled and arranged within the system 100. The interface 134 may define the aperture 110, whose aperture length $d_2$ may be created by forming recesses within each of the nozzle part 104a and nozzle part 104b, and placing the parts together with the recesses opposing one another. This may result in an aperture 110 that has accurately sized dimensions that do not vary above a tolerance value when operated in the system 100. Fused silica is especially useful for this purpose because it can be accurately machined and has a low coefficient of thermal expansion, thereby ensuring that the dimensions of the aperture 110 are maintained even under environments where temperature may vary over a large range. In addition fused silica (fused quartz) does not wet with molten silicon, thereby ensuring that silicon does not wick up within the aperture 110 in circumstances in which the nozzle 104 is brought into inadvertent contact with the melt 112.

As further shown in FIG. 1C and FIG. 1D, the bottom surface 132 may lie parallel to the X-Z plane and parallel to the exposed surface 114. In various embodiments the bottom surface 132 is elongated along a transverse direction that is parallel to the X-axis. The width $w_1$ of the bottom surface 132 along the X-axis may define the eventual width of a crystalline sheet that is pulled in a direction perpendicular to the transverse direction. This latter direction may be referred to herein as a "pull direction" because it coincides with a direction in which a crystalline sheet is pulled. As detailed below, when the bottom surface 132 and nozzle 104 are arranged at a first distance and second distance above the exposed surface 114, respectively, the bottom surface 132 may also extend for a third distance from the nozzle 104 parallel to the exposed surface 114 along the second direction, such that the third distance is greater than the first distance. In other words, as illustrated in FIG. 1D, the bottom surface 132 may extend outwardly from the nozzle 104 for a distance $d_1$ along a direction parallel to the Z-axis, that is, along the pull direction, while the crystallizer 102 is positioned above the exposed surface 114 such that $d_1 > h_1$. In some embodiments $d_1$ is 3 mm and $h_1$ is less than 3 mm. This particular geometry may facilitate more rapid removal of heat as discussed below.

In the particular illustration of FIG. 1D the top view is shown from the perspective of a plane P that is positioned coincident with the bottom surface 132 of the cold block 106. Accordingly the area of the cold block 106 shown is the area of the bottom surface 132, which may be positioned at several millimeters or less above the exposed surface 114. When the cold block 106 is cooled by a cooling fluid such as water, the cold block 106 may have a cold block temperature that is less than 485 K, that is, 1200 K or greater below the melt temperature of the exposed surface 114, which may be 1685 K in some instances such as for processing a silicon melt. Because of the presence of the cold block 106, together with the gas jet provided by the nozzle 104, the heat removal of heat that flows from the exposed surface 114 may be concentrated in a narrow band in which intense heat removal occurs. The intense heat removal may be characterized in some instances by a heat removal rate of greater than 100 W/cm², and in particular embodiments than 1000 W/cm² or greater. Moreover, this heat removal rate may substantially exceed the heat flow outwardly at the exposed surface 114, which may be on the order of 10 W/cm², such as 5-50 W/cm² in some examples.

The region of intense heat removal is shown as the process zone 130 in FIG. 1D. In the process zone 130 the rate of heat removal from exposed surface 114 may exceed the rate of heat removal from exposed surface 114 in outer regions 131 of the exposed surface 114 that lie outside of the process zone 130. In accordance with various embodiments, gas may be directed through the aperture 110 at a sufficient flow rate such that heat removal rate is peaked under the aperture. Moreover, as discussed below, the heat removal rate may be characterized by a narrow peak along the pull direction 120, such that a full width at half maximum (FWHM) is in the range of two millimeters of less, and in some examples less than 0.5 mm. This may result in a maximum value of heat removal rate of up to 1000 W/cm² or greater. When such high heat removal rates are delivered to such a narrow process zone, crystallization of a sheet may be controlled in such a manner to produce improved crystalline quality of sheets even at high pull rates along the pull direction 120.

Figure 2A:
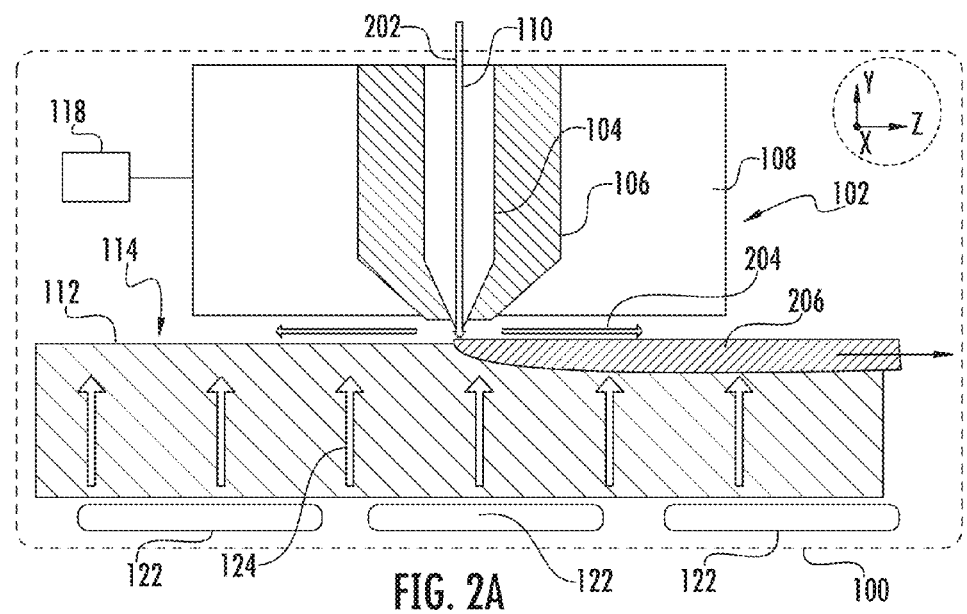
FIG. 2A depicts a side cross-sectional view of one instance of operation of the system of FIG. 1A during growth of a crystalline sheet.

FIG. 2A illustrates one instance of the use of the system 100 to form a crystalline sheet 206. In this example, the heaters 122 provide heat 124 that flows through the melt 112 and flows out of the melt 112 at the exposed surface 114. The heat 124 may maintain the melt 112 in a molten state except for where the crystalline sheet 206 is drawn by a crystal puller (not shown). The rate of heat flow from the melt surface outside of the process zone 130 may be in the range of 5-50 W/cm² in some instances. However the embodiments are not limited in this context. As illustrated in FIG. 2A, a gas jet 202 is provided through the aperture 110, which may be controlled by the gas control system 150 (shown in FIG. 1A). The gas jet 202 may be directed along a direction parallel to the Y-axis or at a non-zero angle with respect to the Y-axis, and may impinge upon the exposed surface 114 and exit as exhaust 204. In various embodiments, the gas flow rate may be characterized by a flow rate per centimeter width of an aperture along the X-axis. In particular embodiments, the gas flow rate may be between 1 L/minute and 10 L/minute per centimeter width (L/(m-cm) of the aperture 110. As detailed below, by controlling the separation of the crystallizer 102 from the exposed surface 114, as well as the flow of gas in the gas jet 202, a large amount of heat may be removed from the exposed surface 114 via convective heat removal in the process zone 130. This facilitates the ability to generate very large heat removal rates overall as noted above.

Figure 2B:
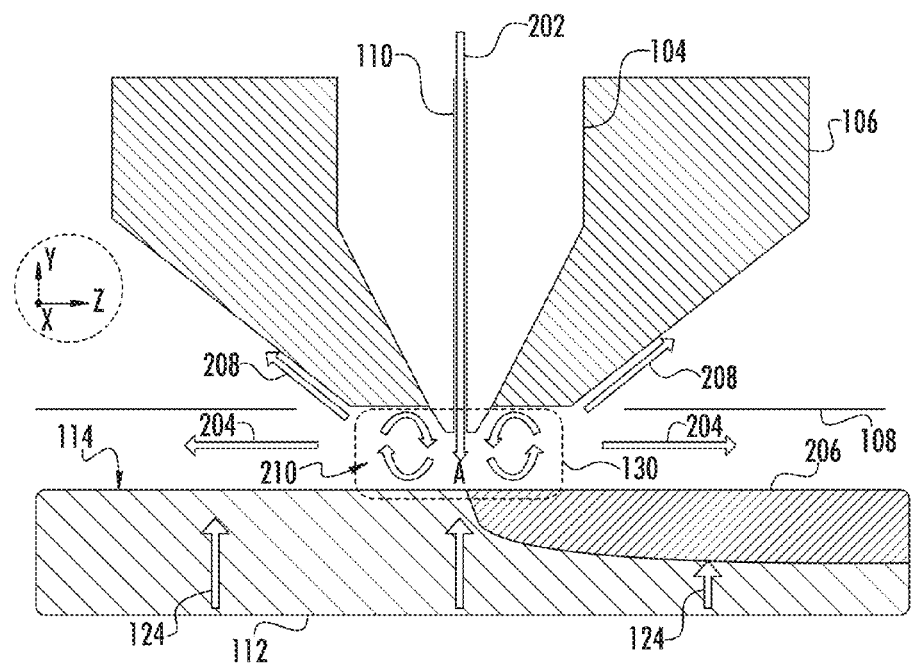
FIG. 2B depicts a close-up side cross-sectional view of the instance of operation shown in FIG. 2A.

Turning now to FIG. 2B there is shown a close-up view of a portion of the system 100 during the operation depicted in FIG. 2A. As illustrated in FIG. 2B the gas jet 202 is directed toward the exposed surface 114, creating a gas vortex 210 that is disposed between the exposed surface 114 and cold block 106 and nozzle 104. The gas vortex 210 provides a medium for rapid removal of heat from the exposed surface 114 as detailed below. In particular, the gas vortex 210 may remove heat from the exposed surface to the cold block at least in part by convection. The heat removal provided by the gas vortex 210 is sufficient in some instances to generate peak heat removal rates of several hundred W/cm² up to 1000 W/cm² or more. This may be especially useful to crystallize a sheet of silicon into a low-defect monocrystalline sheet. The present inventors have identified the fact that in a monocrystalline sheet of silicon grown with its (100) crystallographic plane parallel to the X-Z plane the leading edge is characterized by a (111) crystallographic facet, which forms an angle of 54 degrees with respect to the Z-axis or to pull direction 120. In order to properly grow this faceted leading edge, a very intense rate of heat removal may be needed within a very narrow region at the leading edge. In some estimates the peak heat removal to properly grow the leading edge with the (111) facet may be well over 100 W/cm,² which value is much larger than the heat removal rates accomplished by conventional apparatus used to form crystalline sheets of silicon.

Moreover, in order to control the thickness of the crystalline sheet 206 to no more than a desired upper limit in thickness, it may be desirable to concentrate such high heat removal rate to a narrow region at the leading edge of the crystalline sheet 206. In some embodiments, the system 100 may deliver a narrow region or band of intense heat removal that is less than 3 mm wide, where peak rate of heat removal exceeds a threshold value such as 100 W/cm². In this regard, it is to be noted that the size of process zone 130 along the pull direction 120 may be defined according to a convenient metric, such as the width of a region where heat removal rate exceeds a threshold, or the FWHM of a peak in heat removal rate as discussed below. Regardless of the exact metric used to characterize the extent of the process zone 130, in various embodiments the heat removal rate directly under the aperture 110 at point A may range from 100 W/cm² to 1500 W/cm² while the heat removal rate at distances greater than 3 mm from point A along the pull direction 120 may be less than 20 W/cm.²

As noted, in various embodiments, the gas jet 202 may be composed of helium (He), which provides high thermal conductivity while being inert and unreactive with other components of system 100. However other gases such as hydrogen are possible. In some examples, it may be useful to recirculate gas of the gas jet 202, such as when He is used in the gas jet 202. This may reduce overall consumable expense. As further suggested in FIG. 2B, the gas jet 202 may be exhausted at least partially as exhaust 208 through exhaust channels (not shown) provided adjacent the cold block 106. As detailed below, in addition to conservation of cooling gas, this may provide the advantage that gas jet uniformity is improved in comparison to apparatus in which gas is solely exhausted as exhaust 204 that is directed underneath the enclosure 108.

Figure 3A:
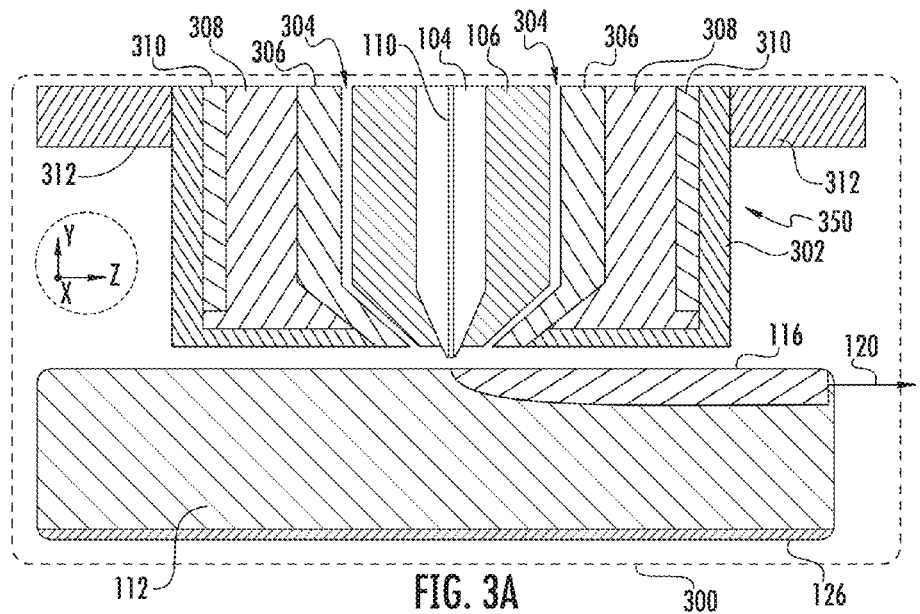
FIG. 3A depicts a side cross-sectional view of another system according to other embodiments of the disclosure.

Turning now to FIG. 3A there is shown a side view of a portion of a system 300 in accordance with further embodiments of the disclosure. The system 300 includes a nozzle 104, cold block 106, and may include a crystal puller (not shown), whose operation has been discussed above. In addition the system 300 may include a gas control system and heaters whose operation has been described above but are omitted for simplicity. Moreover, the system 300 contains an enclosure 350 that includes multiple components as detailed below. The enclosure 350 may include a liner 306 that is adjacent the cold block 106 and is made of graphite or graphite that is coated with silicon carbide. In the embodiment of FIG. 3A at least one inner exhaust channel 304 is provided that is disposed between the cold block 106 and liner 306. In one example, the inner exhaust channel has an entrance whose length parallel to the Z-axis is 1 mm.

Insulator material 308 is provided around the liner 306, and a compensation heater 310 is provided adjacent the insulator material 308 as shown. The compensation heater 310 may be used to adjust the temperature of the enclosure 350 so that the enclosure 350 is maintained at a temperature that is within 10-50 K of the temperature of the exposed surface 114. Finally, a shell 312 may be provided that encloses the other components.

Figure 3B:
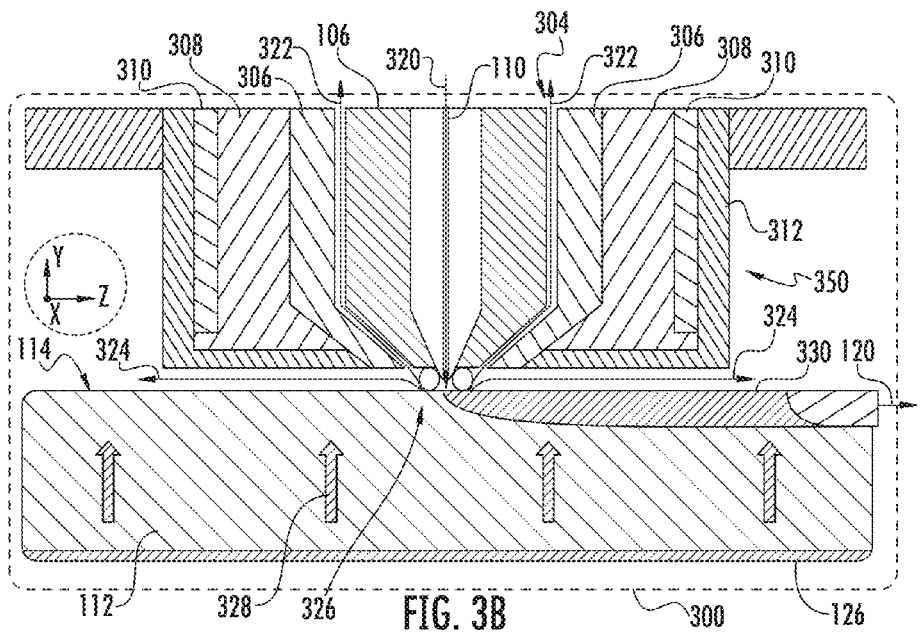
FIG. 3B depicts a side cross-sectional view of one instance of operation of the system of FIG. 3A during growth of a crystalline sheet.

Turning now to FIG. 3B there is shown one instance of operation of the system 300. In this example, a gas jet 320 is provided through the aperture 110 by a gas control system. Heat flow 328 is provided through the melt 112 by heaters (not shown). The gas jet 320 generates gas vortex 326 between the cold block 106 and exposed surface 114 of the melt 112. The gas vortex 326 may be used to rapidly remove heat from the exposed surface 114 so that peak heat removal rate exceeds 100 W/cm². In addition, the gas jet 320 may be exhausted through lateral exhaust 324 which proceeds along directions parallel to the X-Z plane as well as through inner exhaust 322, which proceeds through the inner exhaust channel 304, which may be a pair of channels as shown. As described with respect to the figures to follow, in various embodiments the dynamics of gas flow above a surface such as the exposed surface 114 of the melt 112 may be controlled by controlling gas flow rate, separation of a crystallizer from melt surface, as well as the exhausting of gas after impinging on the surface, among other parameters. This control of gas flow, in turn, may be used to adjust the width of a process zone where heat is rapidly removed, and to adjust the peak heat removal rate, as well as the uniformity of heat removal. As further shown in FIG. 3B when the seed 116 is drawn along the pull direction parallel to the Z-axis, a crystalline sheet 330 is drawn, whose leading edge is stationary and located proximate the gas vortex 326.

Figure 4A:
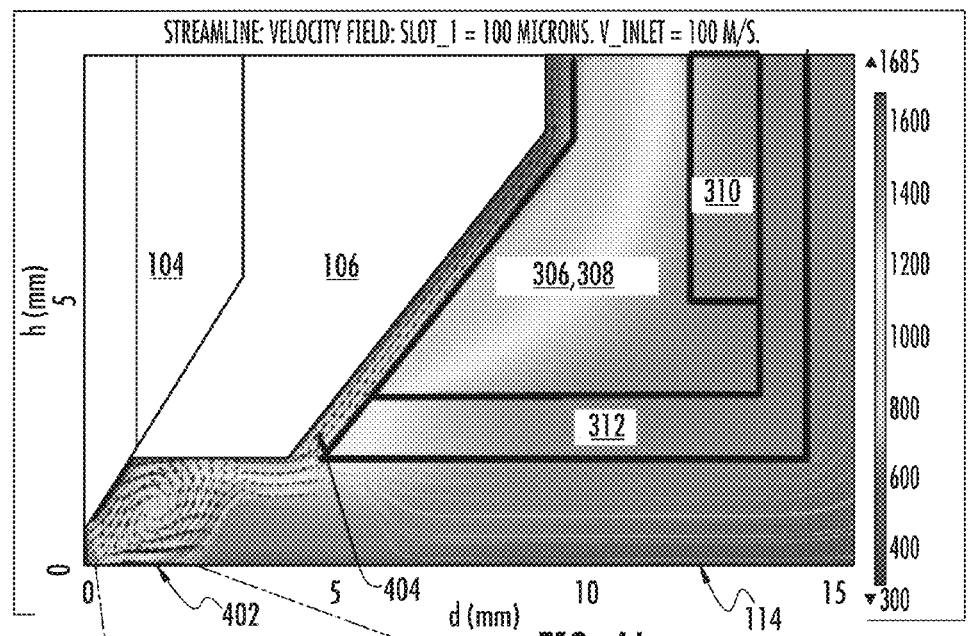
FIG. 4A is a two dimensional composite side view of a portion of the system of FIG. 3A showing modeled flow field and temperature profiles.
Figure 4B:
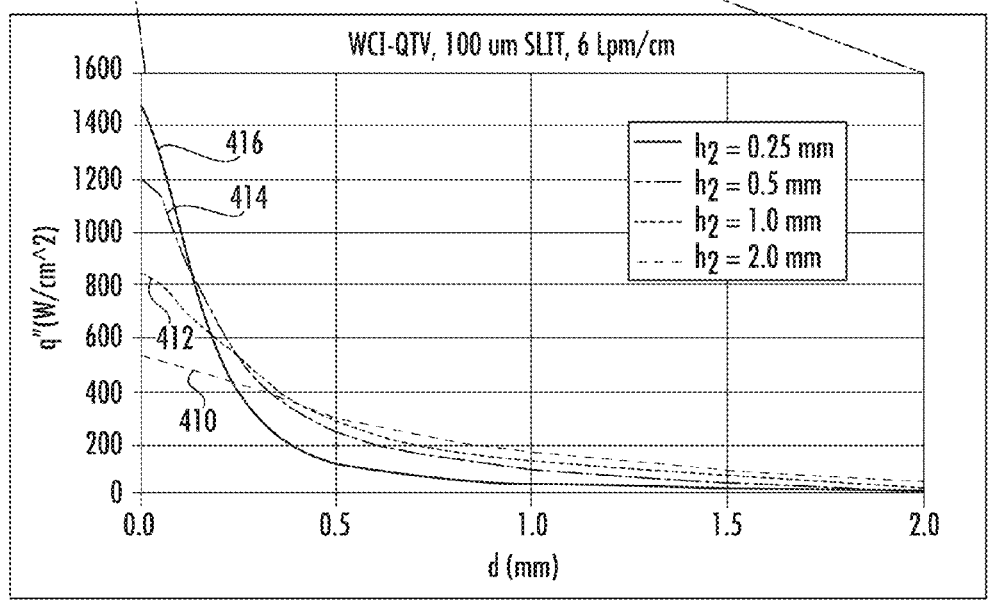
FIG. 4B depicts heat removal rate profiles for four different configurations of the system of FIG. 4A.

FIG. 4A is a two dimensional composite side view of a portion of the system 300 that shows an exemplary temperature two dimensional simulated temperature map and He gas flow patterns that may be generated within the crystallizer 302. The results shown are based upon computational fluid dynamics (CFD) modeling. In this simulation components of the enclosure 350 are hot so that the temperature between the exposed surface 114 and shell 312 is above 1600 K. The cold block 106 and nozzle 104, however, are maintained at temperatures less than 400 K. A gas jet is directed through the nozzle 104 at a velocity of 100 m/s and the nozzle 104 is positioned at a distance $h_2$ equal to 1 mm above the exposed surface 114 of a melt (not shown). In addition, the aperture length $d_2$ of a nozzle along the pull direction 120 is 0.1 mm. As illustrated a strong gas vortex, gas vortex 402, forms between the exposed surface 114 on the one hand and the cold block 106 and nozzle 104 on the other hand. This is indicative of a large rate of convective heat transfer between the exposed surface 114 and crystallizer 302. In addition, gas exhaust 404 is directed through the inner exhaust channel 304. Under this set of conditions, heat removal rate has also been simulated as a function of position along the pull direction 120 (see FIG. 3A) which is indicated as the parameter d. The results of such simulation are plotted in FIG. 4B, which depicts the heat removal rate (q") as a function of d for four different values of $h_2$, including the example of FIG. 4A where $h_2$=1 mm. In the example of FIG. 4B, gas flow rate is 6 liters per minute for each centimeter width ($w_1$) of the aperture 110 along a direction parallel to the X-axis, as shown in FIG. 1D. Thus, for a 4 cm wide aperture gas flow is 24 liters per minute (L/m).

As shown in the results of FIG. 4B the heat removal rate has a maximum at d=0 mm, which position is directly under the aperture of the nozzle 104. At distances greater than 2 mm or so, the heat removal rate approaches a background level in the range of 20 W/cm² that corresponds to heat removal rate from the exposed surface 114 outside of a process zone. In a symmetrical configuration of a nozzle 104 and cold block 106 as shown in FIG. 3A, heat removal rate may accordingly decrease in a similar fashion at negative distances of d with respect to zero. As shown in FIG. 4B the value of heat removal rate at the peak increases strongly with decreases in $h_2$. For example at $h_2$=2 mm, shown in the curve 410, the peak value is 540 W/cm² while at $h_2$=0.25 mm, shown in the curve 416, the peak value is 1480 W/cm². The curve 412 for $h_2$=1.0 mm exhibits a peak value of 840 W/cm² while curve 414 for $h_2$=0.5 mm exhibits a peak value of 1200 W/cm². In addition, assuming that each curve of curve 410, curve 412, curve 414, and curve 416 represents half of a symmetrical peak, the FWHM decreases from 1.2 mm (2×0.6 mm) at $h_2$=2 mm to 0.3 mm (2×0.15 mm) at $h_2$=0.25 mm. Another metric of interest may be the size dz of a process zone of heat removal in which the rate of heat removal exceeds a determined value or threshold. For example, it may be convenient to define a process zone as a zone in which heat removal rate exceeds 100 W/cm². As noted previously, in order to form high quality silicon sheets having the proper (111) facet, a high rate of heat removal at the growing interface of the sheet is needed. Using this metric of a heat removal rate >100 W/cm² the value of dz decreases from 3 mm (2×1.5 mm) at $h_2$=2 mm to 1.2 mm (2×0.6 mm) at $h_2$=0.25 mm. At $h_2$=1 mm as shown in FIG. 4A, the value of dz is 2.5 mm (2×1.25 mm). Accordingly, adjusting the nozzle height above a surface of a melt strongly affects the peak heat removal rate from the surface as well as the dimension (along the pull direction or pull direction 120) of a process zone that represents a region where heat removal from the surface exceeds a threshold.

Figure 5A:
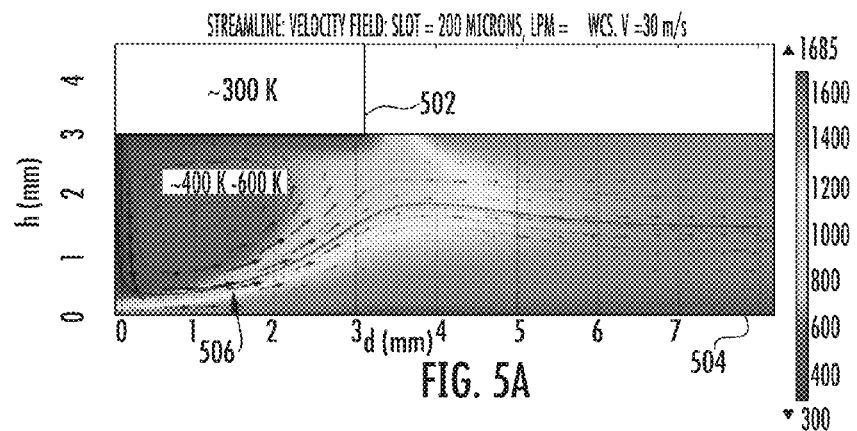
FIG. 5A is a two dimensional composite side view that shows an exemplary two dimensional simulated temperature and flow map when a cold block held at a low temperature is proximate a melt surface.

The provision of a gas jet to the surface of a melt in of itself may generate substantial heat removal from the surface. However, the present embodiments increase the heat removal rate beyond that provided by a gas jet alone by providing a cold block adjacent a nozzle that provides the gas jet. The cold block acts as an effective heat sink for heat that is convectively removed from the melt surface. FIG. 5A is a two dimensional composite side view that shows an exemplary two dimensional simulated temperature map and He gas flow patterns that may be generated when a cold block 502 is maintained at a distance $h_1$ of 3 mm above a surface 504 of a melt. In this simulation, the cold block 502 is maintained at a temperature in the range of 300 K, while the temperature as the surface 504 is in the range of 1680 K. A room temperature He gas jet having a flow rate of 30 m/s is provided at d=0 mm through an aperture having a an aperture length $d_2$=0.2 mm. As illustrated, a strong vortex 506 is generated, which is effective in removing heat from the surface 504 as indicated by the rapid decrease in temperature for d<0.2 mm.

Figure 5B:
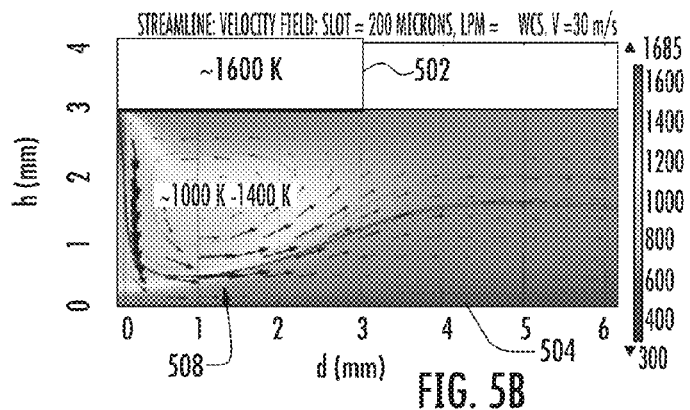
FIG. 5B is a two dimensional composite side view that shows an exemplary two dimensional simulated temperature and flow map when a cold block held at a high temperature is proximate a melt surface.

FIG. 5B is a two dimensional composite side view that shows an exemplary two dimensional simulated temperature map and gas flow patterns that may be generated under the same conditions as in FIG. 5A, except that the cold block 502 is maintained at a temperature in the range of 1600 K. In other words, the simulation of FIG. 5B is representative of a condition in which there is no cold block adjacent a nozzle and cooling is generated from flow of cold gas from the nozzle. As illustrated, a strong vortex 508 is generated; however the vortex temperature remains much higher, such as between 1000 K and 1400 K, than in the case of FIG. 5A, and heat removal from the surface 504 is much less.

Figure 5C:
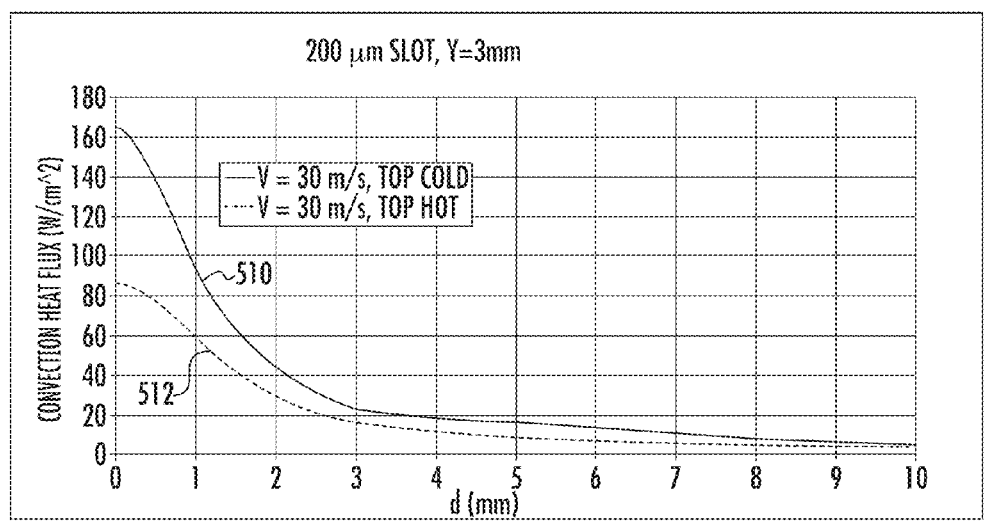
FIG. 5C depicts convective heat removal rate profiles when a cold block is maintained at two different temperatures.

Under the set of conditions illustrated in FIG. 5A and FIG. 5B, heat removal rate has also been calculated as a function of position along the pull direction 120 (see FIG. 3A) which is indicated as the parameter d. The results of such simulation are plotted in FIG. 5C, which depicts the convective heat removal rate as a function of d when the cold block 502 is maintained at 300 K (curve 510) and at 1600 K (curve 512). As shown in FIG. 5C, a peak in convective heat removal is 165 W/cm² for the scenario of FIG. 5A where the cold block 502 is maintained at 300 K, while the peak in convection heat removal is 86 W/cm² for the scenario of FIG. 5B where the cold block 502 is maintained at 1600 K. Following the example above, if it is desirable that heat removal rate exceeds 100 W/cm² it can be seen that this heat removal rate is not met when the cold block 502 is maintained at 1600 K. However, when the cold block 502 is set at 300 K, a process zone in which d=1.8 mm (=2×0.9 mm) is created.

Further simulations have been performed to determine that the amount of heat removal is largely unaffected by whether or not the He gas is exhausted locally to the cold block, such as in an inner exhaust channel 304 shown in FIG. 3. In addition, although the embodiments disclosed hereinabove may apply to a symmetric crystallizer in which a gas jet is directed at a perpendicular incidence with respect to a surface of a melt, in other embodiments, a gas jet may be provided at a non-zero angle with respect to perpendicular to a surface of a melt. In such cases, an asymmetry in distribution of heat removal with respect to the nozzle position may be obtained. Moreover, in some embodiments, each inner exhaust channel 304 may work independently so that an asymmetrical distribution of heat removal may be created exhausting a greater amount of gas in one inner exhaust channel 304 as opposed to another inner exhaust channel 304.

Figures 6A, 6B:
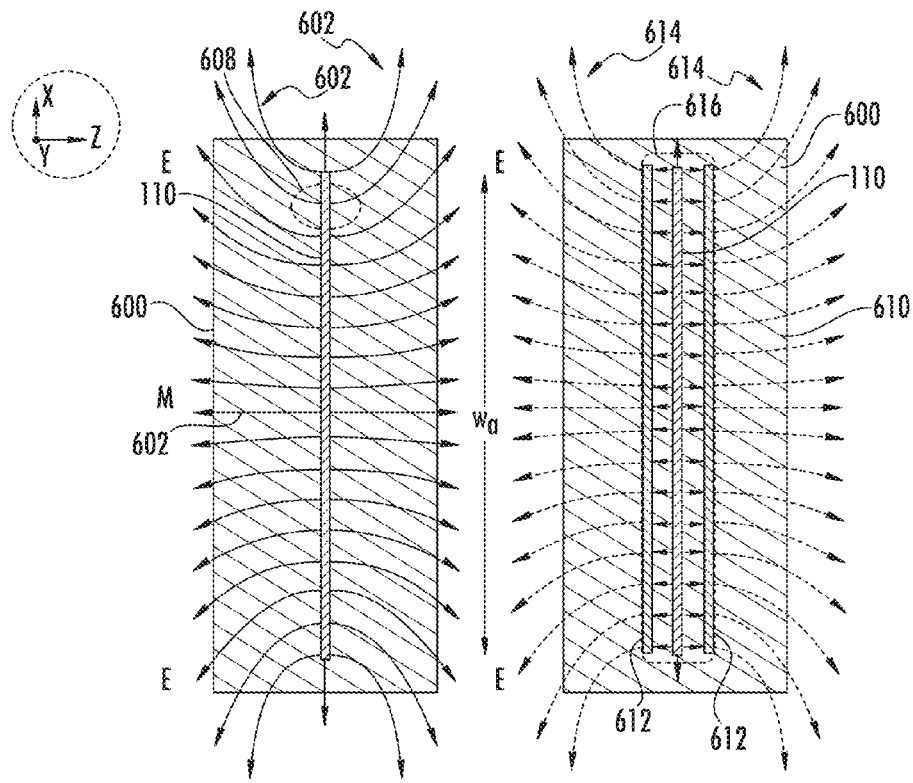
FIG. 6A depicts a top plan view of a pattern of gas flow when gas is directed toward the melt without inner exhaust of the gas.
FIG. 6B depicts a top plan view of a pattern of gas flow when gas is directed toward the melt with inner exhaust provided.

As previously noted, various embodiments provide crystallizers having an inner exhaust channel adjacent a cold block. This feature may be advantageous to provide a more uniform heat removal from a crystallizing front of a sheet along the direction perpendicular to the pulling direction. FIG. 6A depicts a top plan view of a surface of a melt 600 and the pattern of gas flow when He gas is directed toward the melt (into the page) through an aperture 110 of a nozzle (not specifically shown). As illustrated, the aperture 110 has the cross-sectional shape in the X-Z plane of an elongated slit. Exemplary dimensions of the aperture 110 may be 0.1-0.3 mm along the Z-axis and 20 min to 200 mm along the X-axis. It may be assumed that a heated enclosure is provided above the melt 600 that has an opening that defines a rectangular cold region around the aperture 110. In the example of FIG. 6A no inner exhaust channels are provided near the aperture 110 to exhaust the helium gas locally.

It can be seen that in the middle region M of the aperture 110, the gas flow contour 602 is mostly perpendicular to the X-axis, that is, the long direction of the aperture 110. However, proceeding outwardly toward either end E of the aperture 110, the shape of a gas flow contour 602 is curved and is not perpendicular to the long direction of the aperture 110, even in regions immediately adjacent the aperture 110, such as region 608. Moreover, the pattern of the assembly of gas flow contours 602 may represent qualitatively the uniformity of heat removal adjacent the aperture 110. Thus, heat removal in the middle region M where the gas flow contour 602 is perpendicular to the X-axis is different than the heat removal in region 608 where the gas flow contour 602 has a "U" shape. This pattern of gas flow may result from the pattern of flow created by a heated enclosure, which varies due to 3-dimensional effects depending on location along the aperture 110. Thus at regions near either end E, there is less impedance to outward He flow than at the middle region M. The arrangement of FIG. 6A may therefore produce a variable heat removal rate adjacent the aperture 110 when proceeding parallel to the X-axis. Because the crystallization front of a sheet being formed is parallel to the X-axis, it can be expected that crystallization may take place in a non-uniform manner along the leading edge, resulting in a sheet that has less than desired uniformity.

FIG. 6B also depicts a top plan view of a surface of the melt 600 and the pattern of gas flow when Helium gas is directed toward the melt through aperture 110 of a nozzle. However, in the example of FIG. 6B two inner exhaust channels 612 are provided that may extend in a parallel fashion to the aperture 110. In one example the inner exhaust channels 612 may be spaced from the aperture 110 a distance of 3 mm along the Z-axis. In the example of FIG. 6B it may be assumed that 90% of the gas provided through the aperture 110 is exhausted through the inner exhaust channels 612 while 10% is exhausted along the surface of the melt 600 as illustrated in FIG. 2B, for example. The presence of the inner exhaust channels 612 alters the pattern of the gas flow contours 614 as compared to gas flow contours 602. Although the gas flow contours 614 may exhibit some curvature such as in regions towards ends E, within the region bounded by the inner exhaust channels 612, along the entire width $w_a$ of the aperture 110, each gas flow contour 614 is perpendicular to the long direction of the aperture 110, that is, to the X-axis. Thus, in the region between inner exhaust channels 612 the rate of heat removal may be uniform adjacent the aperture 110 at any point along the aperture 110 between ends E. Notably, the region 616 between ends E and between inner exhaust channels 612 represents the region where a cold block extends proximate the surface of the melt 600 where the most rapid removal of heat takes place. Thus a process zone where heat removal is much higher may lie in the region 616. Outside of this region 616 where the gas flow contours 614 are curved, the rate of heat removal is sufficiently low that any variations along the X-direction it may not contribute perceptibly to crystallization of a leading edge. Accordingly, crystallization of a sheet formed under the scenario of FIG. 6B may be uniform along the entire width $w_a$.

Figure 7:
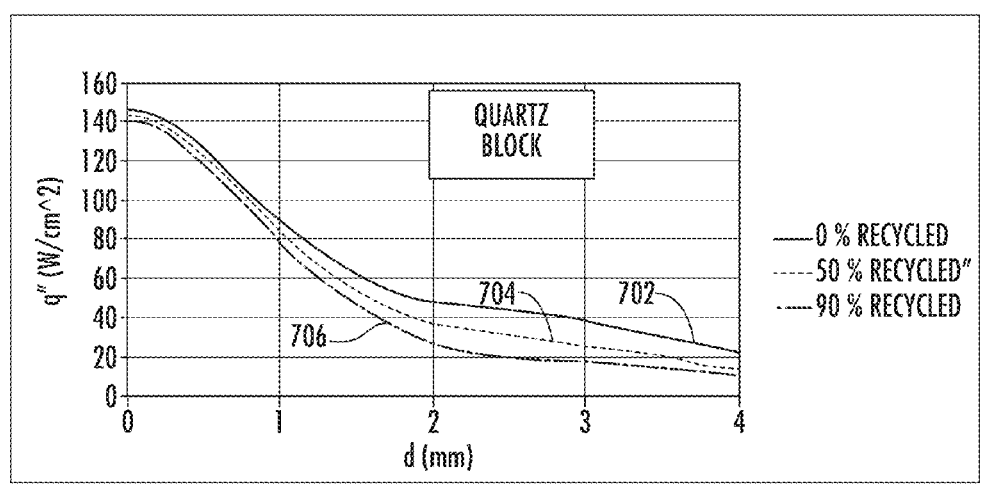
FIG. 7 depicts exemplary heat removal profiles shown as a function of the percentage of inner exhaust.

FIG. 7 depicts the effect of varying the amount of gas exhausted through inner exhaust channels on the profile of heat removal as a function of d. As can be seen changing from when 0% of gas is exhausted (recycled) through inner exhaust channels to 90% of gas exhausted through inner exhaust channels, the peak heat removal rate merely decreases by 2-3%. More advantageously, the FHHM decreases at 90% exhaust so that heat removal is more concentrated at lower values of d thereby reducing the width of a process zone. However, it is to be noted that it may be desirable to exhaust a certain portion of gas delivered from a gas jet, such as 10%, in a direction along the surface of a melt in order to purge any contaminants such as SiO or Ar from the system. The purging of SiO contaminants in particular may prevent formation of SiO particles within a melt that leads to poor quality of a crystalline sheet grown from the melt. Accordingly in various embodiments, the inner exhaust channels may be configured to exhaust between 75 percent to 95 percent of gas provided in a gas jet. At least a portion of the gas that is exhausted through inner exhaust channels may be recycled in some embodiments. In some embodiments the inner exhaust channels may be configured to recycle 70% to 90% of gas provided by a gas jet may be recycled. This may help reduce materials cost such as when the gas jet is composed of helium.

In various additional embodiments the width of a process zone for intense heat removal may be varied during sheet pulling. In order to produce a wide monocrystalline sheet of silicon it is possible to initiate crystallization using a narrow single crystal seed, such that the width of the monocrystalline sheet is initially narrower than a desired width. For example, it may be desirable to produce a silicon ribbon having a width of 150 mm in order to produce substrates having a similar width. However, at the initial stages of sheet pulling, the initial width of a sheet may be much less, such as 20 mm, which width can then be increased during later stages of pulling. This allows initially-generated dislocations to heal out of the growing ribbon because the distance that a dislocation travels to reach an edge of the narrow sheet may be relatively smaller. In order to widen the sheet during crystal pulling the width of a process region may be gradually increased. In the present embodiments, this may be accomplished by increasing the width of a region in which a gas jet is provided to a substrate.

Figure 8A:
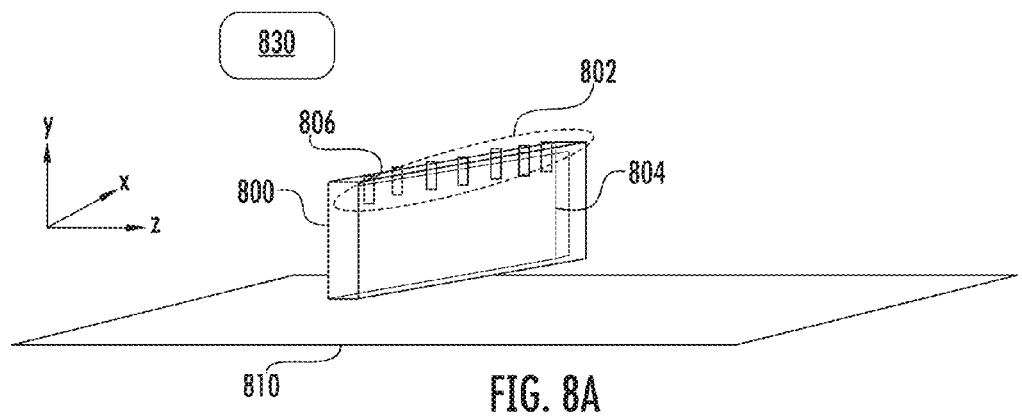
FIG. 8A depicts a perspective view of a nozzle consistent with embodiments of the disclosure.
Figure 8B:
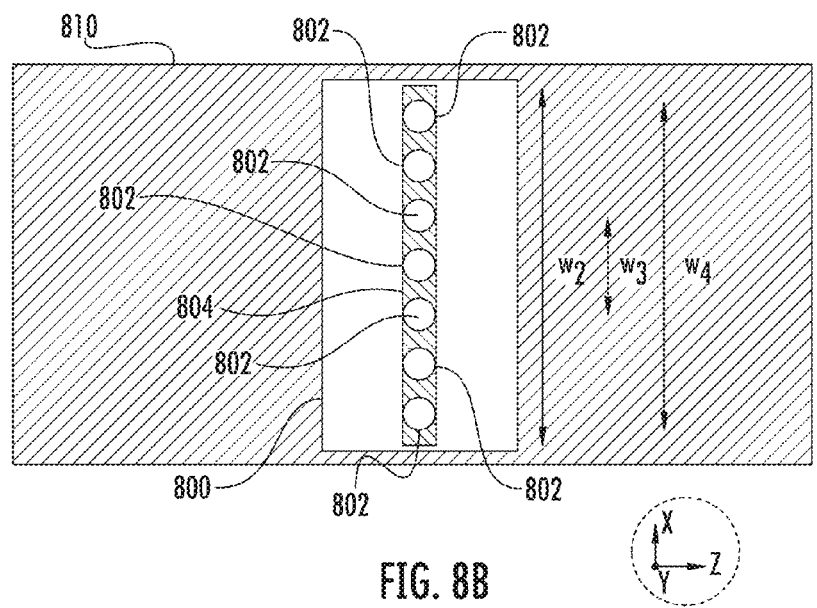
FIG. 8B depicts a top view of the nozzle of FIG. 8A.

The effective width of a gas jet within a nozzle may be increased in different ways. FIG. 8A depicts a perspective view and FIG. 8B depicts a top view, respectively, of a nozzle 800 consistent with additional embodiments of the disclosure. The nozzle 800 may be deployed in a crystallizer as described above, but is shown without additional components such as a cold block for clarity of illustration. However it may be understood that a cold block may encompass the nozzle 800 as shown in FIG. 1A and FIG. 1B, for example. The nozzle 800 is elongated along a transverse direction that is parallel to the X-axis and includes an aperture 804 that extends through the nozzle to provide a gas jet at the surface 810 of a melt. As shown in FIG. 8A and FIG. 8B the nozzle 800 may include a plurality of gas feeds 802 that are arranged to direct individual gas jets through the top of the aperture 804. The plurality of gas feeds 802 may be individually configured to deliver gas to the aperture to form the gas jet when in an active state. For example, in various embodiments, a controller such as gas control system 150 (shown in FIG. 1A) may individually control gas to be directed at any combination of gas feeds provided along an aperture. In an active state, for example, a gas feed is configured to deliver gas to the aperture 804, while in an inactive state a gas feed may not deliver gas to the aperture 804. For example, a controller 830 in the gas control system 150 may be configured to change the number of active gas feeds that deliver the gas so as to alter a width of the process zone along the long axis so that the width of the process zone achieves a target width at a given stage of pulling of a crystalline sheet.

In additional embodiments, the width of an exhaust zone that exhausts gas through inner exhaust channels may be adjusted. For example, a plurality of exhaust ports may be provided along the inner exhaust channel in which an exhaust port exhausts gas in an active state. In some embodiments, the width of the exhaust zone of an exhaust channel may be adjusted by a controller in concert with the adjusting of the process zone width that is accomplished by individually adjusting the number of gas feeds that are in an active state. In particular, a controller 830 may be provided to individually adjust a number of gas feeds that are active to receive gas so as to adjust a width of the process zone along the transverse direction to achieve a target width of the process zone. At the same time, the controller 830 may in concert adjust the number of exhaust ports that are active in the at least one exhaust channel to match the target width. For example, in one implementation $w_2$ may equal 3.5 mm and the number of gas feeds 802 may equal seven as shown. At an early stage of crystal pulling two of the gas feeds 802 that are spaced 5 mm apart from one another may be activated while other gas feeds 802 are inactive in order to generate a process zone width of one centimeter along the transverse direction in a portion of a nozzle aperture. At the same time two corresponding exhaust ports within an inner exhaust channel (not shown) that are spaced 5 mm apart from one another may be used to create an exhaust zone having an exhaust width of one centimeter. At a later stage the number of gas feeds 802 that are active may be increased to seven, while the number of active exhaust ports may also be increased to seven, thereby widening the process zone to 30 mm, for example, while widening an exhaust zone to match the width of the process zone.

Figure 9:
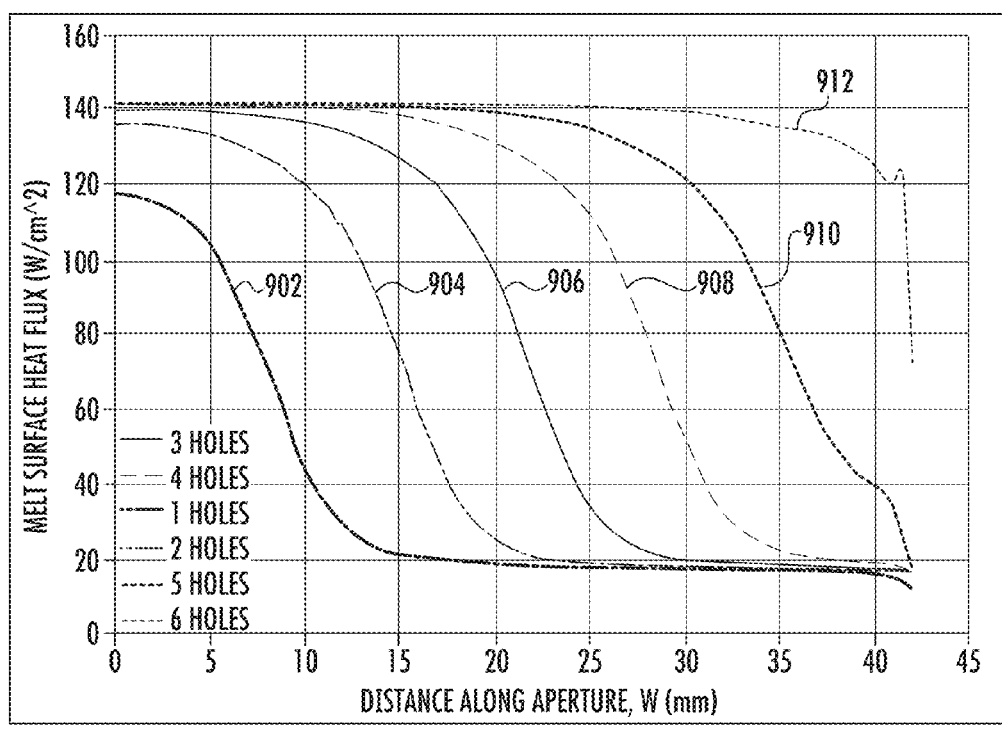
FIG. 9 shows the results of simulation of heat removal rate profiles from a melt surface when the number of gas jets provided along a nozzle aperture is varied.

Turning now to FIG. 9, there is shown the results of simulation of heat removal rate from a melt surface as a function of position (w) when the number of gas jets provided along an aperture is varied. In the simulation of FIG. 9 it may be assumed that at least six gas feeds are spaced equally apart along the width (w) which corresponds to a direction parallel to the X-axis of the figures. The curve 902 illustrates heat removal when a gas jet is directed through a single, first, feed placed at the position w=0 mm is used to feed gas to a surface. For the experimental gas jet flow conditions simulated, a maximum in heat removal is almost 120 W/cm$^2$ and occurs at w=0 while heat removal drops below 100 W/cm$^2$ at w=6 mm. The curve 904 illustrates heat removal when in addition to the first gas feed, a gas jet is directed through a second gas feed placed adjacent the first gas feed. In this case the maximum in heat removal is 135 W/cm$^2$ and occurs at w=0 while heat removal drops below 100 W/cm$^2$ at w=13 mm. The curve 906 illustrates heat removal when in addition to the first gas feed and second gas feed, a gas jet is directed through a third gas feed placed adjacent the second gas feed. In this case the maximum in heat removal is 140 W/cm$^2$ and occurs at w=0 while heat removal does not drop below 100 W/cm$^2$ until w=20 mm. The curve 908 illustrates heat removal when in addition to the first through third gas feeds and a gas jet is directed through a fourth gas feed placed adjacent the third gas feed. In this case the maximum in heat removal is still about 140 W/cm$^2$ and occurs at w=0 while heat removal does not drop below 100 W/cm$^2$ until w=27 mm. The curve 910 illustrates heat removal when in addition to the first through fourth gas feeds and a gas jet is directed through a fifth gas feed placed adjacent the fourth gas feed. In this case the maximum in heat removal is still about 140 W/cm² and occurs at w=0 while heat removal does not drop below 100 W/cm² until w=33 mm. The curve 912 illustrates heat removal when in addition to the first through fifth gas feeds and a gas jet is directed through a sixth gas feed placed adjacent the fifth gas feed. In this case the maximum in heat removal is still about 140 W/cm² and occurs at w=0 while heat removal does not drop below 100 W/cm² until w=42 mm. In addition, the heat removal rate does not vary until w=33 mm. Thus, the width of a region in which heat rate removal exceeds a given threshold can be conveniently increased by directing gas jets through an increasing number of gas feeds located along an aperture. In addition the width of a region in which heat removal is uniform increases as more gas feeds are employed to direct gas to the surface of a melt.

Figure 8C:
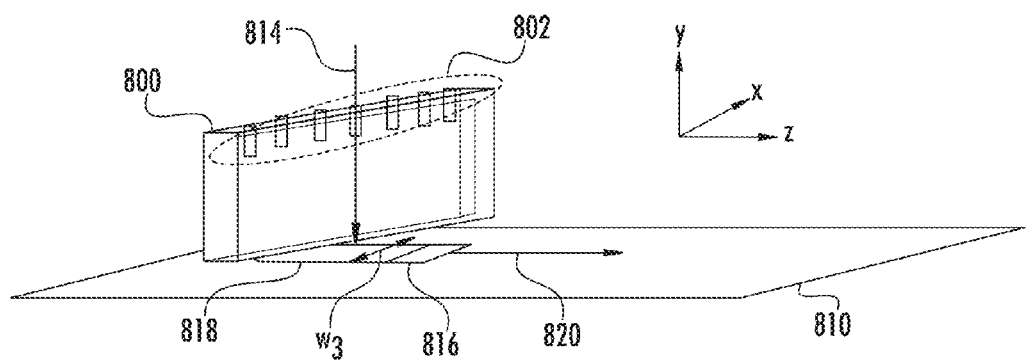
FIG. 8C and FIG. 8D depict two different instances of operation of the nozzle of FIG. 8A.
Figure 8D:
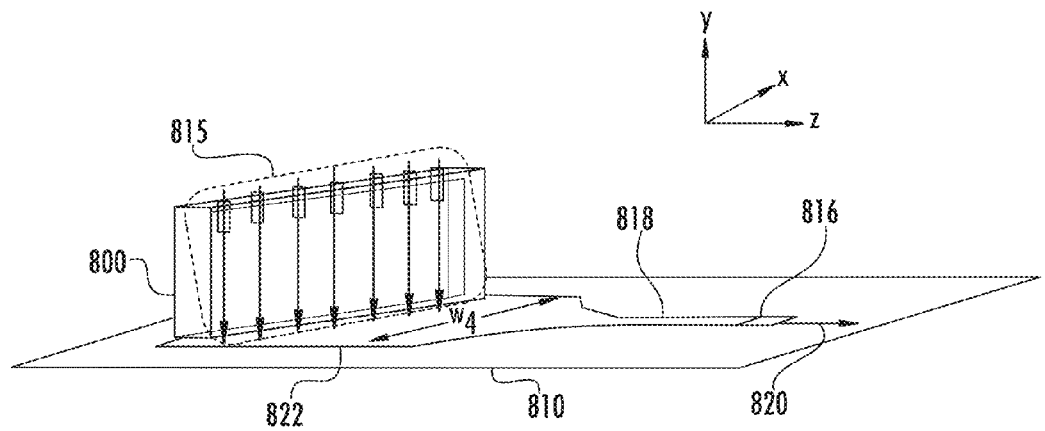

Using the results illustrated in FIG. 9, FIG. 8C and FIG. 8D depict two different instances in one scenario for operating the nozzle 800 to form a wide crystalline sheet. FIG. 8C shows an earlier stage of sheet growth in which a gas jet 814 is comprised of gas directed through a single gas feed, such as gas feed 802, which may be located at any position along the aperture 804. The gas jet 814 may spread out in accordance with the height of the nozzle 800 as it passes through the aperture 804. However, when the gas jet 814 reaches the surface 810 of the melt it may still generate a high rate of heat removal in just a portion of the width $w_2$ of the aperture 804 shown in FIG. 8B. This results in the formation of a process zone (not shown) whose width $w_3$ is substantially less than $w_2$ as also shown in FIG. 8B. In turn, when a crystalline seed 816 is pulled along the direction 820 the width of the resulting sheet, crystalline sheet 818, may also approximate $w_3$. In order for the width of the crystalline sheet 818 to be increased, the width of the process zone may be increased by placing a greater number of gas feeds 802 in an active state so that gas is directed into the aperture 804 through a greater number of gas feeds 802. This may be done in a monotonic fashion in one example such that the number of gas feeds used to deliver gas to the nozzle 800 increases monotonically with time. At a subsequent instance shown in FIG. 8D, each gas feed 802 may be placed in an active state such that gas is delivered through each gas feed 802 to form a wide gas jet, gas jet 815, resulting in a wider process zone that generates a wider portion 822 of the crystalline sheet 818, having a width $w_4$ as also shown in FIG. 8B. Continued pulling when all gas feeds 802 are in an active state may result in a uniformly wide crystal having the desired width, such as $w_4$ In sum, the present embodiments provide multiple advantages over conventional apparatus to grow a crystalline sheet from a melt. The use of a crystallizer that provides a gas jet to generate a convection region between a surface of a melt and a cold block facilitates heat removal at very high rates such as 100 W/cm² to 1500 W/cm². Although not previously appreciated, these high heat removal rates generate conditions for proper growth of monocrystalline silicon sheets in which a (111) facet forms at the leading edge of a growing sheet. The provision of an inner exhaust channel adjacent a cold block also leads to more uniform gas flow pattern over the surface of a melt, leading to greater uniformity in growth conditions across the width of a growing sheet. In addition, the use of separately controllable multiple gas feeds and exhaust ports to direct gas jets to a surface of a melt facilitates growth of high quality crystalline sheets by allowing the width of a process zone to uniformly expand during crystal pulling which increases the width of the crystalline sheet in a controlled fashion.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A crystallizer system for growing a crystalline sheet from a melt, comprising:
   a crucible for housing the melt;
   a cold block having a cold block surface that directly faces an exposed surface of the melt, the cold block configured to generate a cold block temperature at the cold block surface that is lower than a melt temperature of the melt at the exposed surface; and
   a nozzle disposed within the cold block and configured to deliver a gas jet to the exposed surface, wherein the gas jet and the cold block are interoperative to generate a process zone that removes heat from the exposed surface at a first heat removal rate that is greater than a second heat removal rate from the exposed surface in outer regions outside of the process zone.

2. The crystallizer system of claim 1, wherein the cold block surface is disposed at a first height above the exposed surface and a tip of the nozzle is disposed at a second height above the exposed surface that is less than the first height.

3. The crystallizer system of claim 2,
   wherein the cold block surface and the nozzle are elongated in a transverse direction, and
   wherein the cold block surface extends from the nozzle along a pull direction perpendicular to the transverse direction for a distance that is greater than the first height.

4. The crystallizer system of claim 1, wherein the nozzle comprises fused silica.

5. The crystallizer of claim 1, wherein the nozzle contains an aperture comprising an elongated cross-section whose long axis extends along a transverse direction that is perpendicular to a pull direction.

6. The crystallizer system of claim 1, further comprising an actuator configured to adjust a height between the cold block surface and the exposed surface.

7. The crystallizer system of claim 5, further comprising a plurality of gas feeds disposed at different locations along the aperture, wherein the plurality of gas feeds are individually configured to deliver gas to the aperture to form the gas jet when in an active state.

8. The crystallizer system of claim 7, further comprising a controller configured to change a number of gas feeds of the plurality of gas feeds that are in the active state so at to alter a width of the process zone along the long axis.

9. The crystallizer system of claim 5, wherein the nozzle comprises a first nozzle part and second nozzle part, the first nozzle part having a first recess and the second nozzle part having a second recess that opposes the first recess, wherein the first recess and the second recess define the aperture.

10. The crystallizer system of claim 5, wherein an aperture length of the aperture along the pull direction is 0.05 mm to 0.5 mm.

11. The crystallizer system of claim 5, further comprising:
an enclosure that defines an opening in which the cold block surface is disposed opposite the exposed surface, the enclosure having an enclosure temperature hotter than the cold block temperature; and
at least one inner exhaust channel disposed between the enclosure and the cold block and configured to exhaust between 75% and 95% of gas from the gas jet.

12. The crystallizer system of claim 11, wherein the at least one inner exhaust channel is elongated along the transverse direction and comprises a plurality of exhaust ports that are individually configured to exhaust gas when in an active state, the system further comprising:
a plurality of gas feeds disposed at different locations along the aperture, and individually configured to deliver gas to the aperture when in an active state to form the gas jet; and
a controller configured to:
adjust a number of gas feeds that are in the active state so as to adjust a width of the process zone along the transverse direction to a target width; and
adjust a number of exhaust ports that are in the active state in the at least one exhaust channel in order to generate an exhaust width that matches the target width.

13. The crystallizer system of claim 1, wherein the gas jet is configured to generate a gas vortex within the process zone that removes the heat at least in part by convection from the exposed surface to the cold block.

14. The crystallizer system of claim 1, wherein the first heat removal rate is greater than 100 W/cm$^2$.

15. The crystallizer system of claim 1, wherein the nozzle comprises an aperture having an elongated cross-section defined by a width along a transverse direction, and wherein a flow rate of the gas jet is at least one liter per minute for every centimeter width (1 L/(m–cm)) of the aperture along the transverse direction.

16. The crystallizer system of claim 11, wherein the at least one inner exhaust channel is configured to recycle 70% to 90% of gas provided by the gas jet.

17. A method for growing a crystalline sheet from a melt, comprising:
providing the melt in a crucible;
arranging a cold block directly above an exposed surface of the melt;
generating, at a cold block surface of the cold block that faces the melt, a cold block temperature that is lower than a melt temperature of the melt at the exposed surface; and
delivering a gas jet to the exposed surface through a nozzle disposed within the cold block, wherein the gas jet and the cold block are interoperative to generate a process zone that removes heat from the exposed surface at a first heat removal rate that is greater than a second heat removal rate from the exposed surface in outer regions outside of the process zone.

18. The method of claim 17, further comprising generating, using the gas jet, a gas vortex within the process zone that removes heat from the exposed surface by convective heat removal, wherein a convective heat removal rate in the process zone is more than half of the first heat removal rate.

19. The method of claim 17, further comprising:
providing an enclosure around the cold block wherein the enclosure defines an opening in which the cold block surface is disposed opposite the exposed surface;
generating an enclosure temperature of the enclosure that is higher than the cold block temperature;
providing at least one inner exhaust channel between the enclosure and the cold block; and
exhausting between 75 percent and 95 percent of gas from the gas jet through the at least one exhaust channel.

20. The method of claim 19,
wherein the nozzle comprises an aperture equipped with a plurality of gas feeds disposed along the aperture and individually configured to deliver gas to the aperture when in an active state to form the gas jet, and the at least one inner exhaust channel comprises a plurality of exhaust ports that are individually configured to exhaust gas when in an active state, the method further comprising:
adjusting a number of gas feeds that are in the active state so as to adjust a width of the process zone to a target width; and
adjusting a number of exhaust ports that are in the active state in the at least one exhaust channel to provide an exhaust width that matches the target width.

\* \* \* \* \*